US007285445B2

(12) United States Patent
Owen et al.

(10) Patent No.: US 7,285,445 B2
(45) Date of Patent: Oct. 23, 2007

(54) DIRECT COOLING OF LEDS

(75) Inventors: Mark D. Owen, Beaverton, OR (US);
Francois Vlach, Beaverton, OR (US);
Duwayne R. Anderson, Saint Helens, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 0 days.

(21) Appl. No.: 11/423,918

(22) Filed: Jun. 13, 2006

(65) Prior Publication Data

US 2006/0216865 A1 Sep. 28, 2006

Related U.S. Application Data

(62) Division of application No. 11/083,525, filed on Mar. 18, 2005, now Pat. No. 7,235,878.

(60) Provisional application No. 60/554,632, filed on Mar. 18, 2004.

(51) Int. Cl.
*H01L 21/44* (2006.01)
*H01L 21/48* (2006.01)
*H01L 21/50* (2006.01)

(52) U.S. Cl. .................. 438/116; 438/25; 438/26; 438/30; 438/E23.098; 257/680; 257/714

(58) Field of Classification Search ............... 438/48, 438/64, 116, 24, 25, 26, 30, 51; 257/433, 257/714, 443, 680, 434
See application file for complete search history.

(56) References Cited

U.S. PATENT DOCUMENTS

| 3,586,959 A | 6/1971 | Eccles et al. |
| 4,011,575 A | 3/1977 | Groves |
| 4,435,732 A | 3/1984 | Hyatt |
| 4,530,040 A | 7/1985 | Petterson |
| 4,595,289 A | 6/1986 | Feldman et al. |
| 4,684,801 A | 8/1987 | Carroll et al. |
| 5,003,357 A | 3/1991 | Kim et al. |
| 5,067,799 A | 11/1991 | Gold et al. |
| 5,195,102 A | 3/1993 | McLean et al. |
| 5,296,724 A | 3/1994 | Ogata et al. |
| 5,397,867 A | 3/1995 | Demeo |
| 5,418,384 A | 5/1995 | Yamana et al. |

(Continued)

FOREIGN PATENT DOCUMENTS

EP 146998 A1 7/1985

(Continued)

OTHER PUBLICATIONS

PCT International Search Report and Written Opinion dated Jun. 7, 2006 for International Application No. PCT/US04/36046, filed Oct. 29, 2004, 6 pages.
PCT International Search Report and International Preliminary Examination Report dated Nov. 19, 2003 for International PCT Application No. PCT/US03/14625, filed May 8, 2003, 6 pages.

(Continued)

*Primary Examiner*—Nitin Parekh
(74) *Attorney, Agent, or Firm*—Ganz Law, P.C.

(57) ABSTRACT

A thermal management system is provided for semiconductor devices such as an LED array, wherein coolant directly cools the LED array. Preferably, the coolant may be selected, among other bases, based on its index of refraction relative to the index associated with the semiconductor device.

9 Claims, 10 Drawing Sheets

U.S. PATENT DOCUMENTS

| | | |
|---|---|---|
| 5,424,544 A | 6/1995 | Shelton et al. |
| 5,490,049 A | 2/1996 | Montalan et al. |
| 5,522,225 A | 6/1996 | Eskandari |
| 5,554,849 A | 9/1996 | Gates |
| 5,555,038 A | 9/1996 | Conway |
| 5,660,461 A | 8/1997 | Ignatius et al. |
| 5,782,555 A | 7/1998 | Hochstein |
| 5,785,418 A | 7/1998 | Hochstein |
| 5,806,965 A | 9/1998 | Deese |
| 5,857,767 A | 1/1999 | Hochstein |
| 5,892,579 A | 4/1999 | Elyasaf et al. |
| 6,049,175 A | 4/2000 | Forsberg |
| 6,058,012 A | 5/2000 | Cooper et al. |
| 6,088,185 A | 7/2000 | Ratliff et al. |
| 6,141,040 A | 10/2000 | Toh |
| 6,155,699 A | 12/2000 | Miller et al. |
| 6,163,036 A | 12/2000 | Taninaka et al. |
| 6,232,659 B1 | 5/2001 | Clayton |
| 6,291,839 B1 | 9/2001 | Lester |
| 6,318,886 B1 | 11/2001 | Stopa et al. |
| 6,366,017 B1 | 4/2002 | Antoniadis et al. |
| 6,367,950 B1 | 4/2002 | Yamada et al. |
| 6,373,635 B1 | 4/2002 | Fujimoto et al. |
| 6,419,384 B1 | 7/2002 | Lewis et al. |
| 6,420,199 B1 | 7/2002 | Coman et al. |
| 6,459,919 B1 | 10/2002 | Lys et al. |
| 6,480,389 B1 | 11/2002 | Shie et al. |
| 6,498,355 B1 | 12/2002 | Harrah et al. |
| 6,525,335 B1 | 2/2003 | Krames et al. |
| 6,534,791 B1 | 3/2003 | Hayashi et al. |
| 6,536,923 B1 | 3/2003 | Merz |
| 6,541,800 B2 | 4/2003 | Barnett et al. |
| 6,547,249 B2 | 4/2003 | Collins, III et al. |
| 6,554,451 B1 | 4/2003 | Keuper |
| 6,561,640 B1 | 5/2003 | Young |
| 6,573,536 B1 | 6/2003 | Dry |
| 6,578,989 B2 | 6/2003 | Osumi et al. |
| 6,607,286 B2 | 8/2003 | West et al. |
| 6,630,689 B2 | 10/2003 | Bhat et al. |
| 6,683,421 B1 | 1/2004 | Kennedy et al. |
| 6,686,581 B2 | 2/2004 | Verhoeckx et al. |
| 6,708,501 B1 | 3/2004 | Ghoshal et al. |
| 6,796,698 B2 | 9/2004 | Sommers et al. |
| 6,815,724 B2 | 9/2004 | Dry |
| 6,800,373 B2 | 10/2004 | Gorczyca |
| 6,800,500 B2 | 10/2004 | Coman et al. |
| 6,822,991 B2 | 11/2004 | Collins, III et al. |
| 6,831,303 B2 | 12/2004 | Dry |
| 6,857,767 B2 | 2/2005 | Matsui et al. |
| 6,880,954 B2 | 4/2005 | Ollett et al. |
| 6,992,335 B2 | 1/2006 | Ohkawa |
| 6,995,348 B2 | 2/2006 | Bradley et al. |
| 6,995,405 B2 | 2/2006 | Braddell et al. |
| 7,009,165 B2 | 3/2006 | Hehemann et al. |
| 7,071,493 B2 | 7/2006 | Owen et al. |
| 2001/0002120 A1 | 5/2001 | Bessendorf et al. |
| 2001/0030782 A1 | 10/2001 | Trezza |
| 2001/0046652 A1 | 11/2001 | Ostler et al. |
| 2002/0176250 A1 | 11/2002 | Bohler et al. |
| 2002/0187454 A1 | 12/2002 | Melikechi et al. |
| 2003/0038943 A1 | 2/2003 | Almarzouk et al. |
| 2003/0086454 A1* | 5/2003 | Nagano et al. ............ 372/35 |
| 2003/0128552 A1 | 7/2003 | Takagi et al. |
| 2003/0230765 A1 | 12/2003 | Dry |
| 2004/0000677 A1 | 1/2004 | Dry |
| 2004/0011457 A1 | 1/2004 | Kobayashi et al. |
| 2004/0026721 A1 | 2/2004 | Dry |
| 2004/0090794 A1 | 5/2004 | Ollett et al. |
| 2004/0113549 A1 | 6/2004 | Roberts et al. |
| 2004/0119084 A1 | 6/2004 | Hsieh et al. |
| 2004/0124002 A1 | 7/2004 | Mazzochette et al. |
| 2004/0134603 A1 | 7/2004 | Kobayashi et al. |
| 2004/0135159 A1 | 7/2004 | Siegel |
| 2004/0141326 A1 | 7/2004 | Dry |
| 2004/0166249 A1 | 8/2004 | Siegel |
| 2004/0188696 A1 | 9/2004 | Hsing Chen et al. |
| 2004/0196653 A1 | 10/2004 | Clark et al. |
| 2004/0201995 A1 | 10/2004 | Galli |
| 2004/0203189 A1 | 10/2004 | Chen et al. |
| 2004/0206970 A1 | 10/2004 | Martin |
| 2004/0222433 A1 | 11/2004 | Mazzochette et al. |
| 2004/0238111 A1 | 12/2004 | Siegel |
| 2005/0018424 A1 | 1/2005 | Popovich |
| 2005/0024834 A1 | 2/2005 | Newby |
| 2005/0024864 A1 | 2/2005 | Galli |
| 2005/0088964 A1 | 4/2005 | Hackman et al. |
| 2005/0098299 A1* | 5/2005 | Goodson et al. ............ 165/80.3 |
| 2005/0152146 A1 | 7/2005 | Owen et al. |
| 2005/0218468 A1 | 10/2005 | Owen |
| 2005/0230600 A1 | 10/2005 | Olson et al. |
| 2005/0231713 A1 | 10/2005 | Owen et al. |
| 2005/0253252 A1 | 11/2005 | Owen et al. |
| 2005/0285129 A1 | 12/2005 | Jackson, III et al. |
| 2006/0033205 A1 | 2/2006 | Sauciuc et al. |

FOREIGN PATENT DOCUMENTS

| | | |
|---|---|---|
| EP | 1033229 A2 | 9/2000 |
| EP | 1467416 A2 | 10/2004 |
| EP | 1469529 A2 | 10/2004 |
| EP | 1502752 A2 | 2/2005 |
| GB | 2396331 A1 | 6/2004 |
| GB | 2399162 A | 9/2004 |
| JP | 2003268042 A | 9/2003 |
| WO | WO03096387 A2 | 11/2003 |
| WO | WO03096387 A3 | 11/2003 |
| WO | WO2004009318 A1 | 1/2004 |
| WO | WO2004011848 A2 | 2/2004 |
| WO | WO2004038759 A2 | 5/2004 |
| WO | WO2004038759 A3 | 5/2004 |
| WO | WO2004045016 A2 | 5/2004 |
| WO | WO2004078477 A1 | 9/2004 |
| WO | WO2004078637 A2 | 9/2004 |
| WO | WO2004078637 A3 | 9/2004 |
| WO | WO2004082021 A1 | 9/2004 |
| WO | WO2004097516 A2 | 11/2004 |
| WO | WO2005041632 A2 | 5/2005 |
| WO | WO2005043598 A2 | 5/2005 |
| WO | WO2005043954 A2 | 5/2005 |
| WO | WO2005091392 | 9/2005 |
| WO | WO2005094390 A2 | 10/2005 |
| WO | WO2005100961 A2 | 10/2005 |
| WO | WO2005101535 | 10/2005 |
| WO | WO2006072071 A2 | 7/2006 |

OTHER PUBLICATIONS

PCT International Search Report and Written Opinion dated Jun. 3, 2005 for International PCT Application No. PCT/US04/36260, filed Oct. 28, 2004, 6 pages.

PCT International Search Report and Written Opinion dated Jun. 17, 2005 for International PCT Application No. PCT/US04/36370, filed Nov. 1, 2004, 6 pages.

PCT International Search Report and Written Opinion dated Aug. 26, 2006 for International PCT Application No. PCT/US05/09407, filed Mar. 18, 2005, 6 pages.

Petroski, James; Spacing of High-Brightness LEDs on Metal Substrate PCB's for Proper Thermal Performance: 2004, IEEE Inter Soc. Conference on Thermal Phenomena; pp. 507-514.

Not yet published copies of related U.S. Appl. No. 11/434,544, filed May 12, 2006; Specification and Figures; , 28 pages.

Siegel, S.—Curing with UV LED's—abstract only—IS&T's NIP19: 2003 International Conference on Digital Printing Technologies, p. 365, 1 sheet.

Examiner cited in related U.S. Appl. No. 10/984,589, filed Nov. 8, 2004 —Electromagnetic Spectrum, 1 page, printed Aug. 16, 2006 www.brocku.ca/earthsciences/people/gfinn/optical/spectrum.gif.

PCT International Preliminary Report on Patentability dated Nov. 23, 2006 for International PCT Application No. PCT/US06/009076, filed Mar. 18, 2005, 8 pages.

Not yet published copies of related U.S. Appl. No. 11/614,753, filed Dec. 21, 2006; Specification and Figures; 58 pages.

PCT International Search Report and PCT Written Opinion dated Oct. 13, 2006 for International PCT Application No. PCT/US05/13448, filed Apr. 19, 2005, 8 pages.

PCT International Search Report and PCT Written Opinion dated Sep. 28, 2006 for International PCT Application No. PCT/US05/11216 filed Mar. 30, 2005, 9 pages.

PCT International Search Report and PCT Written Opinion dated Oct. 16, 2006 for International PCT Application No. PCT/US05/09076 filed Mar. 18, 2005, 10 pages.

Not yet published copies of related U.S. Appl. No. 11/342,363, filed Jan. 26, 2006; Specification and Figures; 44 pages.

* cited by examiner

DIRECT COOLING OF LEDS

RELATED APPLICATIONS

This application is a Divisional and claims the benefit of U.S. Non-Provisional patent application Ser. No. 11/083,525, filed Mar. 18, 2005, now U.S. Pat. No. 7,235,878 which claims priority to and the benefit of U.S. Provisional Patent Application Ser. No. 60/554,632, filed Mar. 18, 2004, the contents of which are hereby incorporated by reference as if recited in full herein for all purposes.

BACKGROUND OF THE INVENTION

This invention relates to thermal management of semiconductor devices and, more particularly, to thermal management of semiconductor devices by direct cooling.

Light-emitting diodes (LEDs) consist of a PN junction formed by two dissimilarly doped semiconductors as shown in FIG. 1. In this junction, one of the semiconductors (p) is doped so the majority carriers are positive (holes), while the other semiconductor (n) is doped so the majority carriers are negative (electrons). By applying an external electric field across the junction, current can be made to flow, and when the holes from the p-type and electrons from the n-type meet at the junction they combine and release a photon of light.

The wavelength of the light depends on the bandgap energy of the materials used in the PN junction. By adjusting the materials used, as well as the doping, a wide range of wavelengths is possible, including wavelengths in the ultraviolet (UV) and infrared (IR) portion of the electromagnetic spectrum. Other electrical components can be made using PN or similar junctions using semiconductors. In all these devices the electrical current and voltage required for operation (whether an LED or not) represent power, and the amount of power in a DC circuit is:

$$P = V \times I$$

where P is the power, V is the voltage, and I is the current. In an LED, the conversion from electrical power to optical power is not 100% efficient. Therefore, power that is not released as photons may be absorbed as heat by the LED and the substrate material it is mounted on. The heat generated by the LED leads to a decrease in the output optical power and/or to damage of the device if the temperature is not maintained below a certain level.

While typically less important for operating individual LEDs, thermal management issues tend to be a significant, and often limiting, aspect of the design that goes into large high-power LED arrays. FIG. 2 illustrates the common features of a typical cooling design. LEDs 20, 22, 24 are typically mounted on a substrate 26 that may either act as the heat exchanger or may be mounted to a heat exchanger. Waste heat from LEDs 20, 22, 24 travels by heat conduction through substrate 26 and heat exchanger (if used) where it is picked up by a coolant and removed for release to the environment. The most common feature in typical designs is that heat is removed from the backside of the surface to which LEDs 20, 22, 24 are mounted, which in this example is backside 28 of substrate 26. However, this method of removing heat has disadvantages because it requires the heat to travel through bulk material and (in most cases) several interfaces. Such a system is shown and described in U.S. Pat. No. 6,045,240.

Furthermore, the interface between an LED and the surface to which it is mounted presents heat transfer difficulties. Due to imperfections in materials, the LED and the surface may seem to be in intimate contact while actually being generally separated by a microscopically thin interface. Generally, that interface typically contains one or more undesirable materials, such as, e.g., air. Because air is a very poor thermal conductor, the interface typically is intentionally filled with a selected, thermally conductive material, such as, e.g., epoxy or grease, thereby displacing the undesirable material(s) and improving thermal transport across this interface. Even so, compared with the thermal conductivity of the substrate (and, if used, a heat sink attached to the substrate), this interface may still exhibit relatively low thermal conductivity, leading to undesirably high thermal gradients during the transport of heat energy.

Regardless of the particular characteristics of the thermal path from the backside of the LED into and through the substrate, the heat effectively travels through a thermal circuit that generally has a substantial thermal resistance. Subject to that thermal resistance, the temperature of the LED rises. Moreover, the LED's temperature tends to reach a substantial value in overcoming the thermal resistance and achieving typical heat flow.

Another problem encountered in LED systems that effects thermal management is the efficiency of light transmission. For example, light that is produced within an LED must exit through the LED face. This face represents an optical interface where the index of refraction changes. That change causes reflection of light back toward the LED. Reflected light may be absorbed by the LED, causing it to operate less efficiently. Larger changes in the index of refraction across an interface result in a greater amount of reflection and lessen the amount of transmission. Since LEDs are commonly made of materials with a high index of refraction, the transmission loss at the interface can be significant.

The equation for normal reflection at an optical interface is:

$$R = \left(\frac{n_2 - n_1}{n_2 + n_1}\right)^2$$

where $n_1$ and $n_2$ are the indices of refraction across the interface, and R is the power reflection at normal incidence. For example, if light travels through air (index=1) and strikes a glass surface at normal incidence (n=1.5), then the amount of reflection will be 0.040, or 4%, and the amount of transmission will be 1−R (for lossless interfaces) or 96%.

The material used in the construction of LEDs typically has a very high index of refraction. For example, Cree, Inc. (Durham, N.C.) makes an LED that is constructed of silicon carbide, which has an index of refraction of about 2.8 at short wavelengths near the upper end of the ultraviolet as seen in FIG. 3. With such a high index of refraction, the reflection at an interface of SiC and air is 22.4%, resulting in a transmission of only 77.6%.

What is needed is a system to provide efficient thermal management of a semiconductor device. In another aspect, what is needed is a system that efficiently manages heat generated by an LED so as to increase the operational efficiency and/or lifetime of the LED. In another aspect, what is needed is a system that efficiently manages heat generated by an LED so as to provide for enhanced transmission of light through the LED interface.

SUMMARY OF THE INVENTION

The present invention provides a cooling system for semiconductor devices that applies a coolant directly to a semiconductor device to efficiently remove heat.

In one embodiment, a coolant directly cools a semiconductor device, thus removing waste heat from the device. Since heat is removed directly from the semiconductor device, heat removal is relatively efficient compared to other heat removal configurations, e.g., heat removal through the substrate. Accordingly, if the semiconductor device is driven at a fixed input power, the semiconductor device will generally run cooler using direct cooling, than if other heat removal configurations are used. In such case, because the optical output of the semiconductor device tends to increase with the decreased temperature of the semiconductor device, such direct cooling of the semiconductor device will result in a relative increase in its optical flux. However, because efficient heat removal provided by direct cooling delivers cooler operating temperatures, the semiconductor device may be operated at higher current (power), which increases optical output.

Direct cooling of the semiconductor device preferably is implemented to provide thermal management, and to increase optical output, by reducing the amount of light that is reflected back toward the semiconductor device at its face. Specifically, the coolant may be selected, among other bases, based on its index of refraction relative to the index associated with the semiconductor device. Through this index-based selection of the coolant, reflection at the semiconductor face may be reduced and, indeed, the more the indexes converge, the more reflection at this face is reduced, toward being eliminated or, at least minimized. By so addressing reflection, the optical output power typically is increased beyond the gains associated with heat removal alone.

In another aspect, light from a semiconductor device is directed through a window with optics that collect, condense, and/or collimate the light so as to provide additional optical output. Such optics preferably include an array of micro-lenses that are integrated into such window. Typically, such window provides for containment of the coolant.

In another embodiment, the semiconductor device is one or more LEDs that are mounted in a housing that includes a channel through which a coolant flows. In so flowing, the coolant directly cools the LEDs.

In another embodiment, one or more LEDs may be mounted in a housing that includes plural channels through which one or more coolants flow, directly cooling selected one or more surfaces of one or more LEDs.

In another embodiment, one or more LEDs are mounted on a substrate in a housing that includes plural channels through which one or more coolants flow, directly cooling the LEDs on a first side of the substrate and, as well, cooling an opposite side of the substrate.

Direct cooling of LEDs also provides the possibility of mounting the LEDs on substrates with complex shapes (bound by a complementary shaped window or optic) and directly cooling the LEDs with a coolant. The substrate may be fabricated from various materials, including thin plastic.

A thermal management system is provided for cooling a semiconductor device that includes a housing enclosing a semiconductor device with at least one channel formed in the housing adjacent to the semiconductor device, and a coolant supply for directing a coolant through the housing to flow through the at least one channel to directly cool the semiconductor device.

A method of directly cooling a semiconductor device is provided wherein the semiconductor device is at least one LED, the method comprising applying a coolant directly to the at least one LED. The coolant is selected from any of various appropriate material(s), preferably being a fluid, e.g., including one ore more gases or one or more liquids.

These and other embodiments are described in more detail in the following detailed descriptions and the figures.

The foregoing is not intended to be an exhaustive list of embodiments and features of the present invention. Persons skilled in the art are capable of appreciating other embodiments and features from the following detailed description in conjunction with the drawings.

DETAILED DESCRIPTION OF THE INVENTION

Figure 1:
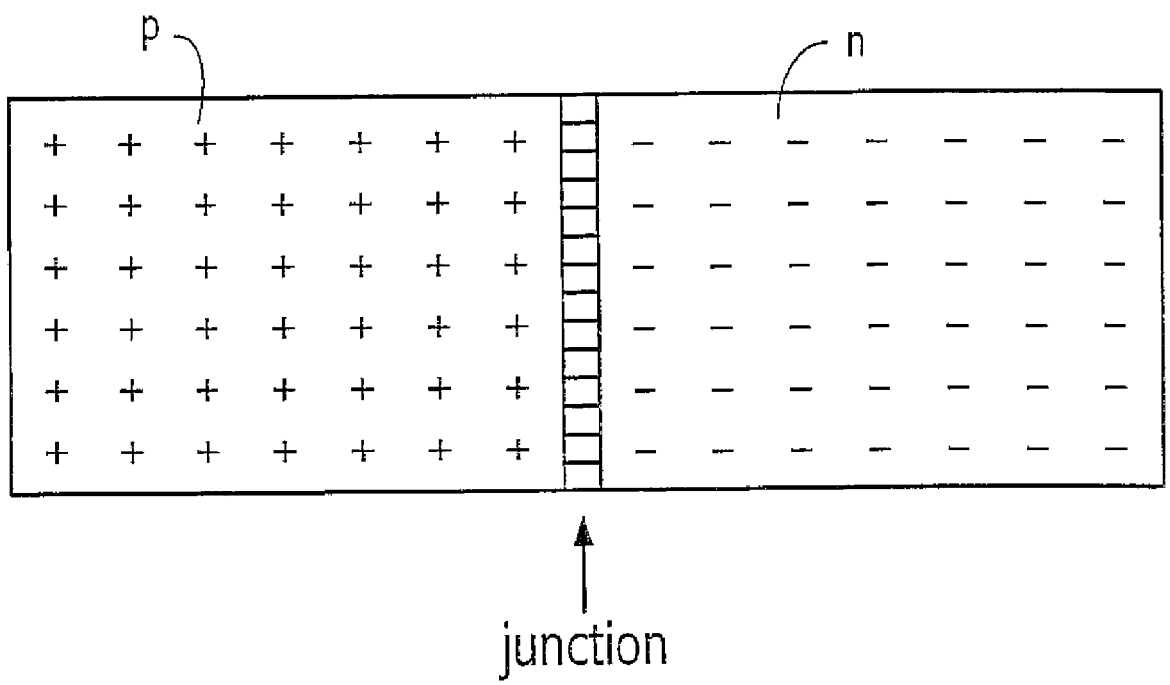
FIG. 1 shows a PN junction commonly used in semiconductor light sources.
Figure 2:
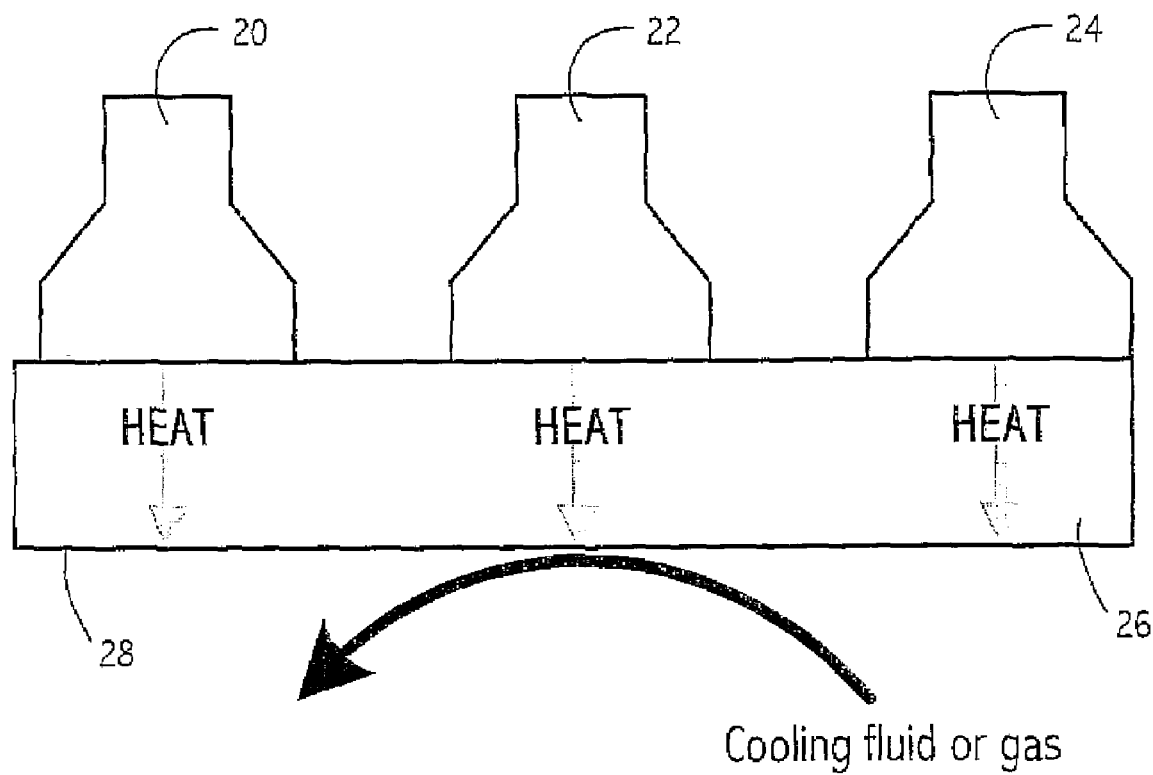
FIG. 2 shows a typical prior art cooling method for LEDs.

Representative embodiments of the present invention are shown in FIGS. 4-13, wherein similar features share common reference numerals.

FIGS. 4-12 show examples of a semiconductor device such as a high-density LED array that may be used for applications requiring high optical power density at the working surface of a target material. In such applications, the target material is exposed with light for the purpose of illuminating or performing a material transformation in or of the target. Such applications may include, for example, curing applications ranging from ink printing to the fabrication of DVDs and lithography. One such high-density LED array is shown and described in U.S. patent application Ser. No. 10/984,589, filed Nov. 8, 2004, the entire contents of which are hereby incorporated by reference for all purposes. The invention is described for direct cooling of LEDs, preferably including the light-emissive surface of LEDs. However, the invention is not intended to be limited to LEDs and may be used to directly cool other semiconductor devices.

Figure 4:
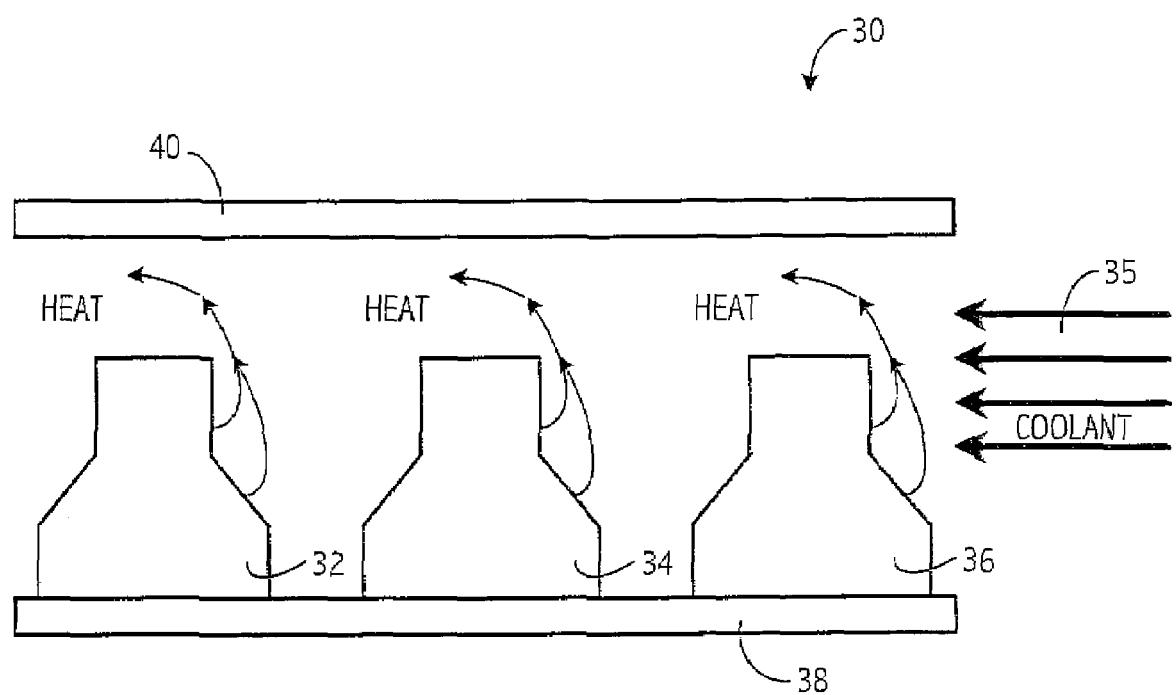
FIG. 4 is a graphic representation showing a cooling system and method of the present invention.

FIG. 4 is a schematic view of an embodiment of a system 30 for directly cooling one or more LEDs 32, 34, 36 mounted on a substrate 38 so that light from LEDs 32, 34, 36 is transmitted through a window 40 to a work surface (not shown). Window 40 preferably has a shape that is complementary to substrate 38 so that the coolant 35 is contained.

In this embodiment, the coolant 35 generally flows among and/or across the LEDs 32, 34, 36 and, preferably, comes into actual contact with one or more of the LEDs 32, 34, 36, so as to provide direct cooling of such semiconductor devices. However, it is understood that direct cooling in accordance with the invention does not require actual contact with the semiconductor device; rather, direct cooling is understood to embrace cooling by the coolant when the coolant cannot actually contact the semiconductor device due to interposed structure (e.g., one or more layers of material, such as dielectric or other protective layer(s), metallization or other interconnect, other materials, or combinations of any of these). However, it is also understood that direct cooling is present if the coolant makes some substantial contact with the semiconductor devices, including through actual contact with such interposed structure. Substantial contact is present when the interposed structure is substantially less thick than a typical substrate or otherwise presents a thermal barrier that is substantially smaller than the thermal barrier associated with a typical substrate.

In this embodiment, the coolant 35 circulates, flowing between substrate 38 and window 40 so as to flow across and among LEDs 32, 34, 36. Generally, such circulation may be constant, or may run at a selected duty cycle, or may be intermittent (running or not based, e.g., on the operation of a controller responsive to various thermal conditions associated with the LEDs).

Coolant flow will tend to be associated with some turbulence. Such turbulence will generally have characteristics based on various factors, including the type of coolant employed, the flow rate and other parameters associated with the coolant itself (e.g., temperature and pressure), the topology of the LEDs, the barriers presented to the flow (e.g., the cross-sectional shapes of the volumes through which the coolant flows), and the materials employed in constructing the volumes through which the coolant flows. In any case, and based on such factors, turbulence preferably is optimized so as to enhance heat removal while minimizing undesirable effects, e.g., any relating to light transmission, particularly any loss of such transmission.

The coolant 35 generally is selected from any of various appropriate material(s). Preferably, the coolant 35 is a fluid, e.g., including one ore more gases or one or more liquids (such as a mixture of liquids). The coolant typically is selected based on one or more various factors. These factors include, as examples: index of refraction; thermal capacity; thermal conductivity; transparency to selected wavelength(s) of light (e.g., selected light of the visible and/or UV spectra); performance (e.g., viscosity) under operating conditions expected for a particular implementation (e.g., ranges of temperatures, pressures, flow rates, etc.); stability and performance over time (e.g., tending not to break down or otherwise have substantial degradation in performance based on use in the system, including exposure to light, heat, and mechanical forces, over time); and reactivity (e.g., preferably, substantially inert; that is, not tending to react, chemically or otherwise, with or on any components or materials of the system and, to the extent some reaction occurs, such reaction causes insubstantial degradation of any system component or material, or system performance, over time). The coolant may be a commercially available material such as liquids marketed by Cargille Laboratories (Cedar Grove, N.J.), having product numbers 5610 (index of refraction between 1.46 and 1.54) and S1056 (index of refraction between 1.398 and 1.46). In addition, the coolant can be modified by adding organic components (such as, for example, Freon), where such components preferably are inert and where such modification is directed to achieve some desired performance, e.g., thermal capacities/conductivities and/or refractive indexes.

The coolant may include polar liquids, such as water (alone or in some selected combination). Polar liquids generally are characterized by a relatively high dipole moment (i.e., in chemistry, a polar material has centers of positive and negative charge distribution that do not converge). Polar liquids tend to have relatively high heat capacities, which is desirable in coolants. However, polar liquids also tend to have relatively high reactivities and, as coolants, they tend to damage unprotected components and materials in the system. Accordingly, polar liquids may be used as coolants, provided that the LED array, metallic surfaces, and other components and materials are protected, e.g., using one or more appropriate, durable dielectric or other protective layers.

Oils, such as olive oil, may also be used, alone or in some selected combination, provided performance is achieved.

As stated above, coolant 35 may be selected, among other bases, based on its index of refraction. This basis responds to the desirability of having the system enhance optical output by reducing the amount of light that is reflected (rather than transmitted) in interfaces between the coolant and materials of the system. As is understood by those skilled in the art, such reflection is due to differences in the indexes of refraction between the coolant and the materials. This selection of coolants is based on consideration of the coolant's index of refraction relative to the index of refraction of the other material associated with a particular interface. This selection may be directed to matching or substantially matching such indexes or to maintaining the index differences within selected ranges. (In any case, selection by refractive indexes and resulting performance is referred to generally as "optical coupling.")

Optical coupling preferably is provided at the interface of the coolant and the light-emissive face of the semiconductor device. Optical coupling preferably is further provided at the interface of the coolant and one or more optical components disposed subsequently in the optical path (e.g., window 40). As an example, where optical coupling is provided between the coolant and each of the device face and such one or more optical components, it is preferred that such couplings are stepped, i.e., the coolant's index of refraction is the same as an index of either the face or optics or is selected to be between the indexes of such face and optics.

Through this optical coupling, reflection at the interfaces may be reduced. Indeed, the more the indexes converge, the more reflection is reduced, toward being eliminated or, at least minimized. It is understood that reflection at the semiconductor device's face may be reduced/minimized/eliminated, while still having index-of-refraction based reflection within the system, e.g., at other interfaces, such as the interface between the coolant and the window and the between the window and the exterior environment. Even so, any such reflection from such index differences will tend to be less degrading than reflection at the semiconductor device's face, in that the reflected light at these later interfaces will tend to be more scattered and, thus, less likely to be reflected back into the semiconductor device itself.

Figure 3:
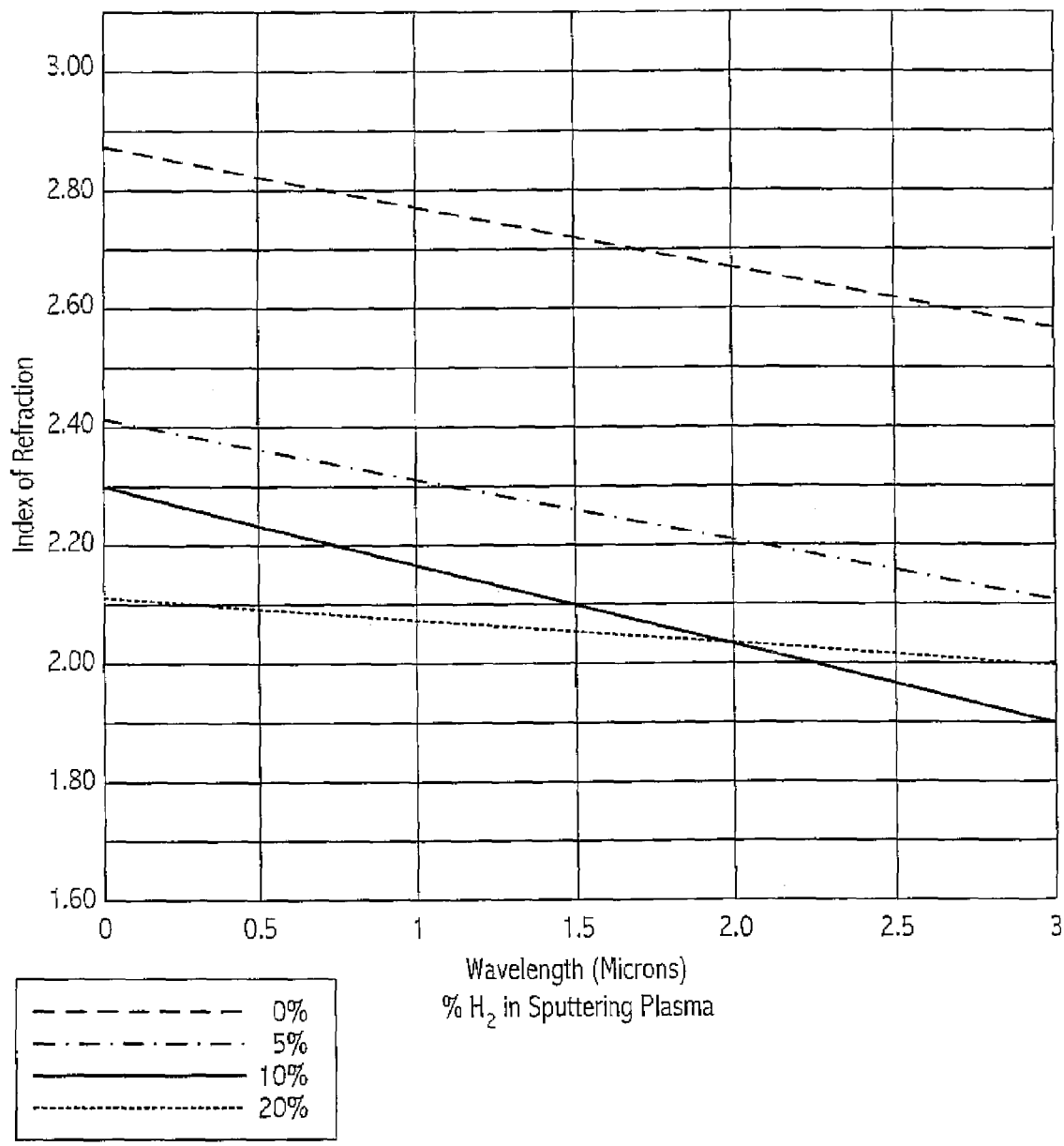
FIG. 3 shows a graph of index of refraction for SiC.
Figure 5:
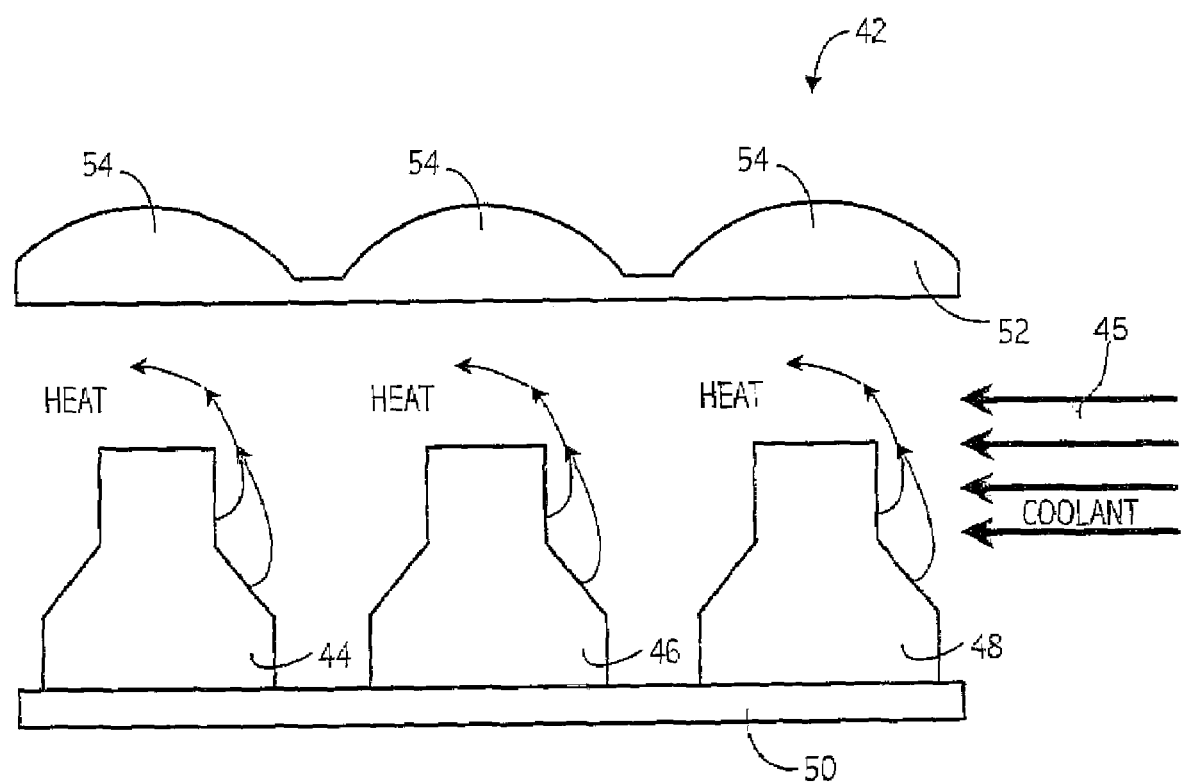
FIG. 5 is a graphic representation similar to FIG. 4 shown with an integrated array of micro-lenses.

FIG. 5 is a schematic view of an other embodiment of a system 42 for direct cooling LEDs similar to system 30 in FIG. 3. In this other embodiment, one or more LEDs 44, 46, 48 are mounted on a substrate 50 so that light from LEDs 44, 46, 48 is transmitted through a window 52 that has associated optics 54. The window 52 contributes to containment of the coolant. Moreover, when light from the LEDs 44, 46, 48 is directed through the window 52, the optics 54 enhance collection, condensing, and/or collimation of the light so as to provide additional optical output. Such optics 54 preferably include an array of micro-lenses that are integrated into such window 52.

In this embodiment, coolant 45 is directed to flow between substrate 50 and window 52 so as to flow among and across, and preferably in actual contact with, LEDs 44, 46, 48. Preferably, the coolant 45 is selected, among other bases, based on its index of refraction relative to the index of refraction associated with the LEDs, as described above. In combination with the operation of the micro-lenses 54, such coolant selection tends to further optimize the optical power density output and, thus, available for application to the work surface.

Figure 6:
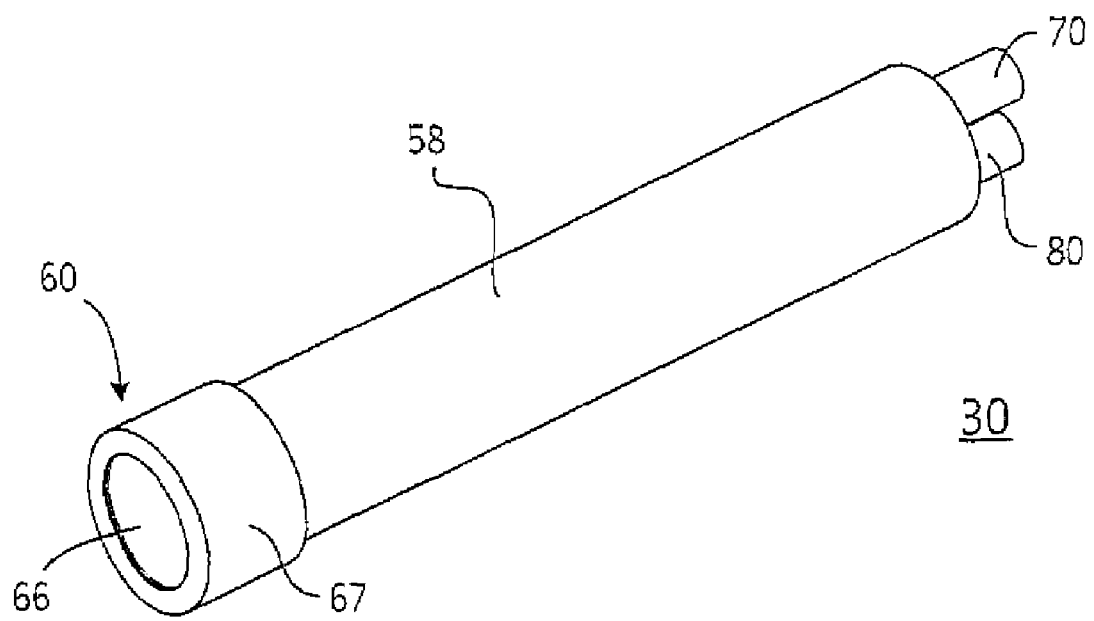
FIG. 6 is a view of one embodiment of the present invention for direct cooling of LEDs.
Figure 7:
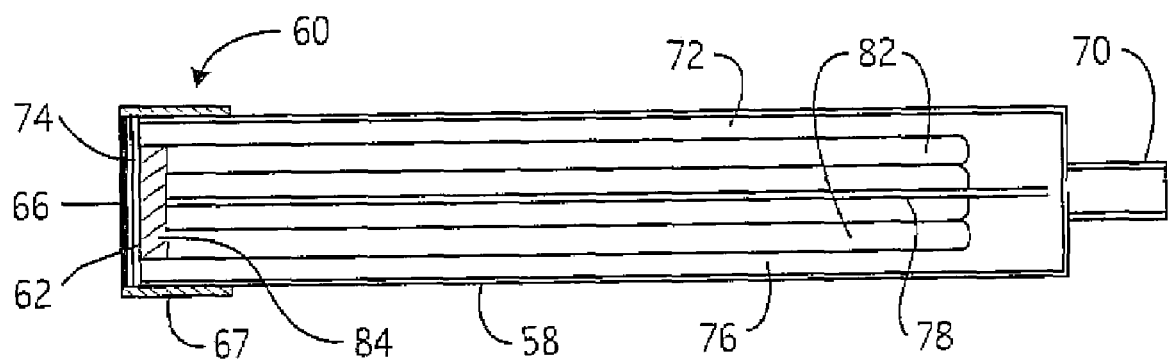
FIG. 7 is a cross-sectional view of the embodiment of FIG. 6.
Figure 8:
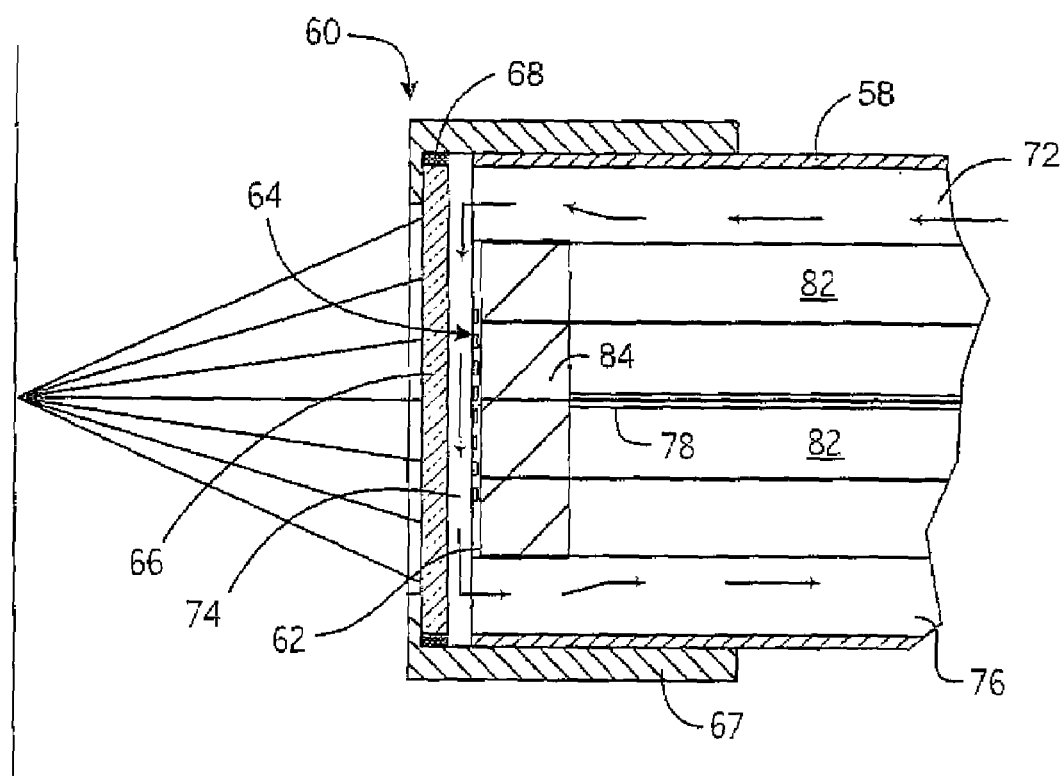
FIG. 8 is an enlarged partial cross-sectional view of the embodiment of FIG. 6 showing the coolant flow path.

FIGS. 6-8 show a first embodiment of a system for direct cooling of LEDs. The system includes a housing 58 having a light emitting end portion 60 that includes a substrate 62 supporting an LED array 64 (FIG. 8). The LED array 64 is powered by electrical supply lines (not shown).

Light emitting end portion 60 further includes a window 66 that may incorporate an array of diffractive and/or reflective optics to collect and collimate light emitted from the LED array 64 to be applied to a work surface (not shown). A seal 68 (FIG. 8) is provided between window 66 and end cap 67 to prevent loss of the coolant. Housing 58 includes an inlet 70 to supply coolant to a supply flow chamber 72. Coolant flows along supply flow chamber 72 and across a lateral channel 74 formed between window 66 and substrate 62 so that the coolant flows among and across, and preferably in actual contact with, the LEDs. The coolant then flows through a discharge flow chamber 76 that is separated from supply flow chamber 72 by a flow chamber divider 78. The coolant continues to flow through discharge flow chamber 76 and out to the environment or other remote location through outlet 80. To further dissipate heat one or more heat pipes 82 made of a thermally conductive material such as copper are connected to substrate 62 through a heat spreader 84 preferably made of a thermally conductive material such as copper. Coolant simultaneously cools heat pipes 82 so as to cool substrate 62.

Preferably, the coolant is supplied from a supply (not shown). The coolant is directed out of housing 58 through outlet 80 to a heat dissipation system (not shown). With dissipation of thermal energy it has carried from the semiconductor device, the coolant is re-circulated through housing 58. The heat dissipation system typically is constructed to enable proper dissipation of the thermal energy from the coolant to the environment or location thermally remote from the semiconductor device, so that the dissipated energy is sufficiently remote from the semiconductor device so as to be unlikely to return to the semiconductor device in an appreciable amount.

System 30 may also include temperature-sensing device(s). The temperature sensing device(s) may be variously implemented. As an example, the temperature sensing device(s) may be implemented using thermistors. Moreover, the temperature sensing device(s) may be variously disposed in or throughout the system 30, so as to sense the temperature of system 30 at one or more selected locations. As examples, the temperature-sensing device(s) may be disposed so as to sense the temperature of one or more of the LED array 64 (at or proximate same, at one or more points thereof), the coolant, the environment to which the heat is removed (e.g., the air), or combination(s) of same.

The temperature sensing devices typically would be connected to one or more controllers (not shown), so as to provide data representative of the sensed temperature, whereby the controller(s) would interpret the data to assess the temperature characteristics in or throughout the system 30. Based on such interpretation, the controller(s) would typically also make one or more selected adjustments to system 30 (e.g., toward controlling the temperature thereof). To illustrate, if the temperature-sensing device(s) senses temperatures of system 30 reaching unacceptable level(s) at any one or more locations, one or more of the controller(s) typically would interpret data received from such temperature-sensing device so as to increase, e.g., the rate at which a pump that pumps the coolant through housing 58 or the action of other cooling components, such as a fan blowing air over a heat exchanger. Alternatively, one or more of the controller(s) may reduce power to, or turn off, the LED array 64 or to selected LEDs or groups of LEDs therein, with or without also increasing either or both of the pumping rate or action of other cooling components. Indeed, the controller(s) may shut down system 30, at least until the indicated temperature falls below a critical or other selected threshold level.

The invention can use a dielectric coating applied to the LED array. This coating generally will act as an insulator or protection layer, enabling use of electrically conductive or chemically active or coolants. Use of such coolants may be desirable in that they generally exhibit enhanced heat capacity or heat conductivity. Such dielectric coating may also be refractive index matched, as described above. Together with a dielectric coating (whether or not index matched), a metal may be applied in association with the LEDs, so as to enhance removal of heat directly from the LED and to provide such heat readily to the coolant (e.g., such coolant typically being circulated as described above). Examples of application of metal in association with an LED array (particularly to provide micro-reflectors) is shown and described in U.S. patent application Ser. No. 11/084,466, titled "MICRO-REFLECTORS ON A SUBSTRATE FOR HIGH-DENSITY LED ARRAY," Attorney Docket number PHO-2.010.US, filed Mar. 18, 2005, claiming priority to U.S. Provisional Application Ser. No. 60/554,628, filed Mar. 18, 2004, the entire contents of which application are hereby incorporated by reference for all purposes.

Figure 9:
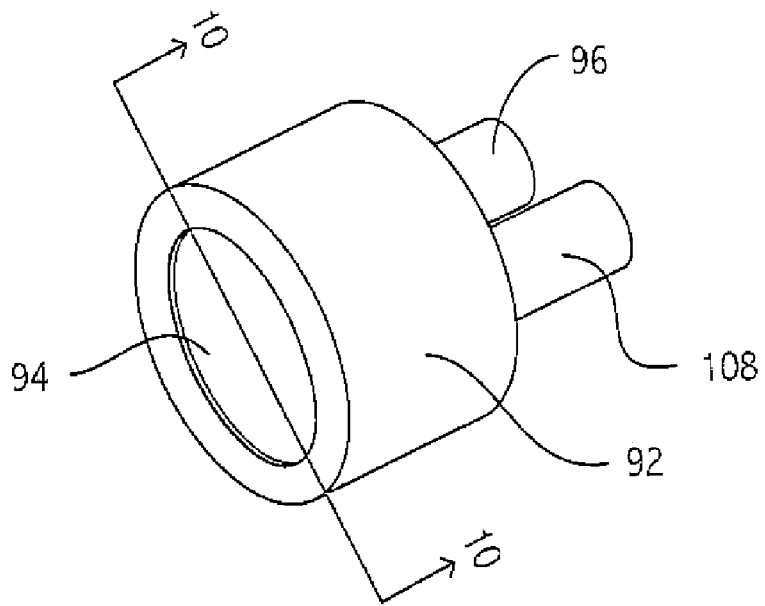
FIG. 9 is a view of another embodiment of the present invention for direct cooling of LEDs.
Figure 10:
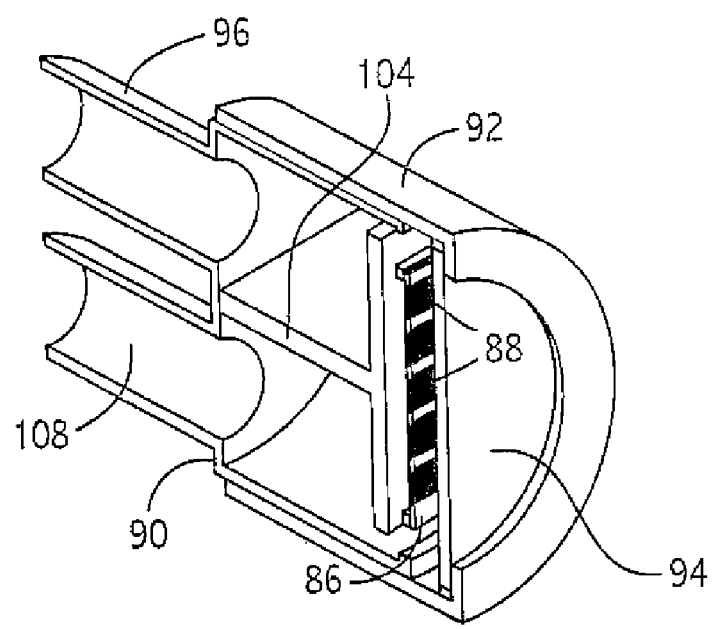
FIG. 10 is a cross-sectional view of the embodiment of FIG. 9 along line 10-10.
Figure 11:
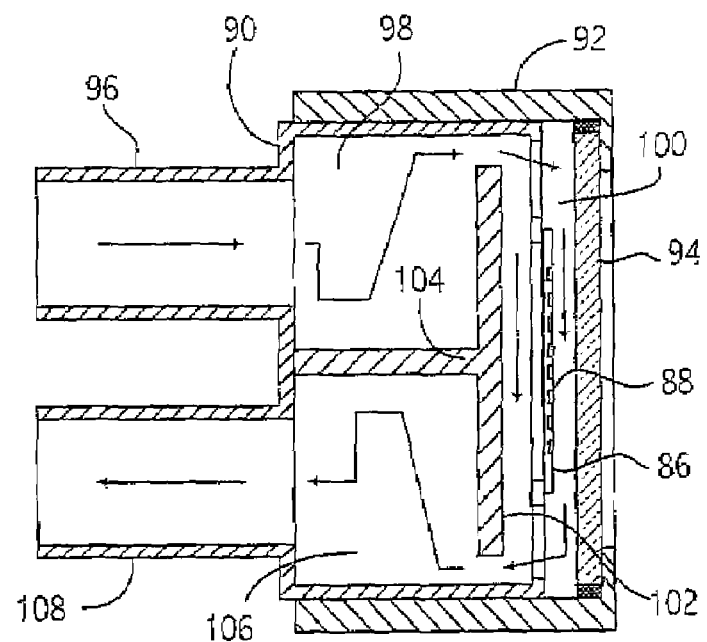
FIG. 11 is a view similar to that of FIG. 10 showing the coolant flow paths.
Figure 12:
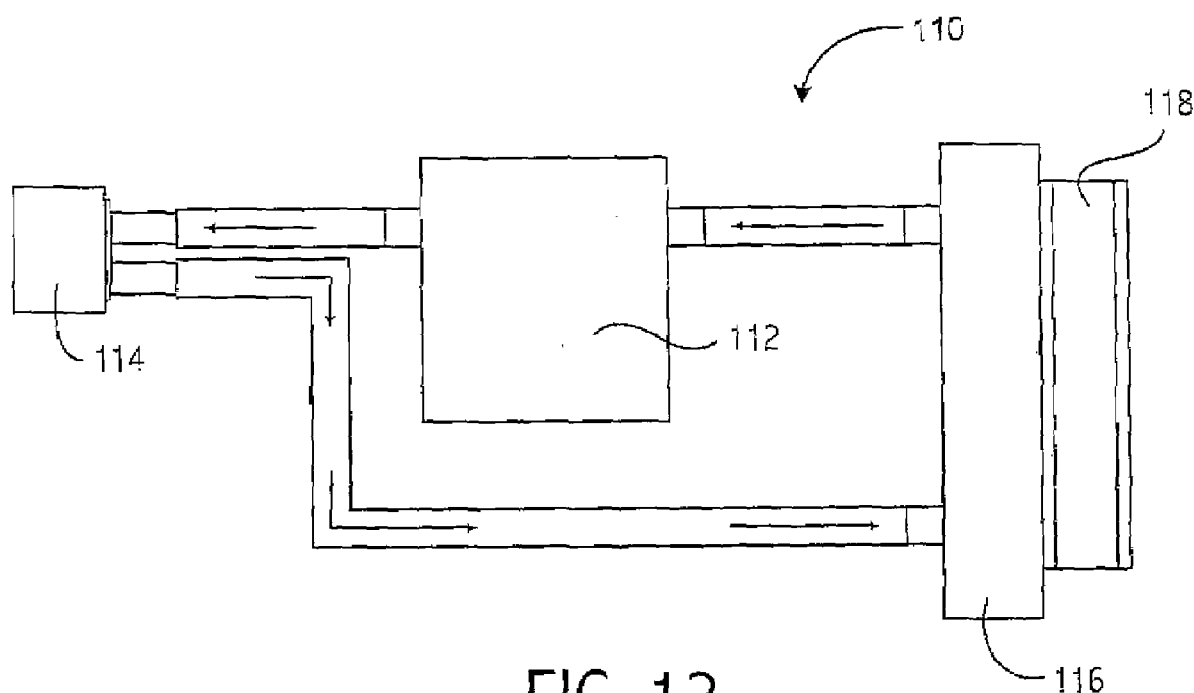
FIG. 12 is a view of a cooling system for use with any of the embodiments of the present invention.

FIGS. 9-11 show another embodiment for direct cooling of LEDs with plural channels for directing the coolant. A substrate 86 with one or more LEDs 88 is mounted on a housing 90 that includes a cover 92 to sealingly enclose substrate 86. Cover 92 includes a window 94 that may incorporate an array of (e.g., diffractive and/or reflective) optics, so as to collect and collimate light emitted from the LED for application at a work surface (not shown). Substrate 86 is mounted within housing 90 so that both a top surface of substrate 86 to which LEDs 88 are mounted and a bottom surface of substrate 86 are exposed for cooling.

In this embodiment, coolant is supplied from a source (not shown) to flow through an inlet 96 and through a supply flow chamber 98. Coolant then flows through both a top lateral channel 100 formed between window 94 and substrate 86 to directly cool LEDs 88 and through a bottom lateral channel 102 formed between substrate 86 and a flow divider 104 to cool the bottom of the substrate 86. Heated coolant then flows through discharge channel 106 and out to a remote location through outlet 108.

Although the embodiment of FIGS. 9-11 show only two channels through which coolant is directed, the invention is not limited to two channels. Other configurations are contemplated in which coolant may flow through one, two, three, or more channels to either directly or indirectly cool LEDs.

The coolant removes heat from the LEDs so the heat can be transported to a remote location and/or released to the environment through a second stage cooling system (e.g., like forced air), thus cooling the coolant for reuse. In such a re-circulating system, the coolant typically passes through a radiator or other heat exchanger over which air is passed (or driven, e.g., via a fan), thus transferring the heat from the coolant to the air, cooling the coolant in the process and, after which, the coolant flows to and directly cools the LEDs again. For example, in a two-stage cooling system 110 such as the one shown in FIG. 12, the coolant is circulated by a pump 112 through a housing 114 that encloses LEDs as discussed above to flow among and/or across (and preferably in actual contact with) the LEDs and the substrate. Coolant may simultaneously cool heat pipes 82, which also act to cool substrate 62. The heated coolant is then cycled through a second stage cooling system, in this example, a forced air cooled radiator 116 that may utilize a fan 118, so as to dissipate the heat in the coolant to the ambient environment remote from the LEDs.

For this system to work optimally, the system typically would be configured to account for a variety of factors. These factors include, e.g., the characteristics of the coolant, the type, number and arrangement of the semiconductor devices in the system, the application to which the system will be put, etc. To illustrate using a few applicable characteristics, the flow rate of the coolant preferably is linked (whether statically or dynamically) to the coolant's thermal heat capacity, the thermal output and temperature requirements in operation of the semiconductor device(s), and the capacity of the remote heat exchanger to dissipate the heat carried there from the semiconductor device by the coolant.

The use of heat pipes and air-cooled radiator as shown here could be replaced by other means by one skilled in the art and is not intended to be restrictive.

Figure 13:
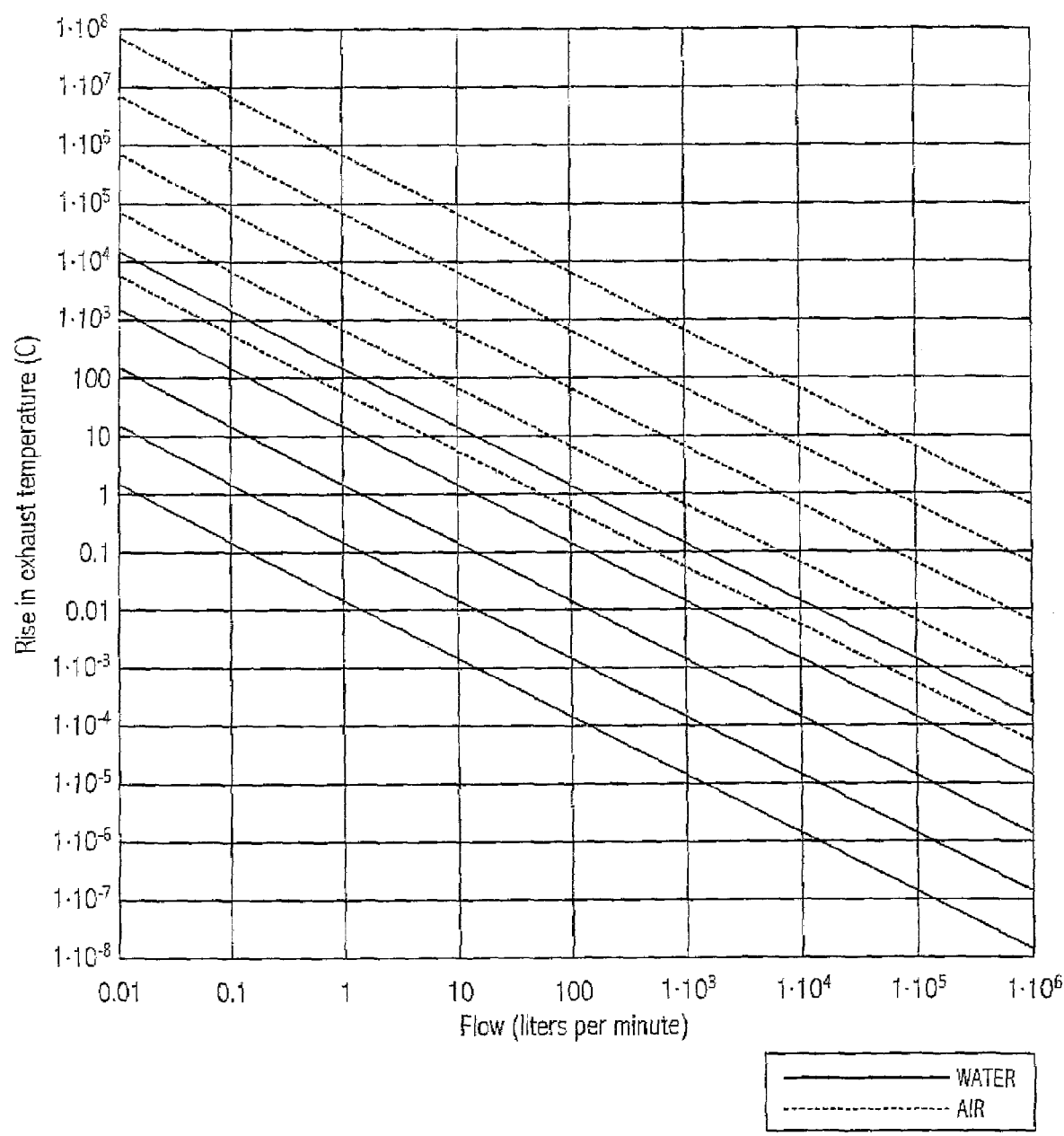
FIG. 13 shows a graph showing the temperature rise of water and air as a function of flow rate and heat power removed by the coolant.

These principles can be shown concisely with the chart in FIG. 13, which shows the amount of temperature rise for two different coolants carrying away various amounts of heat energy as a function of the amount of the rise in temperature of the coolant. This chart shows the temperature rise of water and air as a function of flow rate and heat power removed by the coolant. The lowest water line and the lowest air line both correspond to the coolant carrying away 1 watt of power. The second-to-lowest lines correspond to the coolant carrying away 10 watts. The different lines correspond to different curves when the coolant carries away differing amounts of power. The lowest (closest to x-axis) water line corresponds to 1 watt of power carried away by the coolant and the next-to-the-bottom line corresponds to 10 watts carried away. The top water line corresponds to the case where the water removes 10,000 watts of power. Similarly, the bottom air line corresponds to air carrying away 1 watt of power and the next-to-the-bottom air line corresponds to air carrying away 10 watts of power. The top air line corresponds to the case of air carrying away 10,000 watts of power.

As an example consider an LED array that generates 1,000 watts of waste power. The waste power is efficiently removed with direct cooling of LEDs. Assuming the coolant is water and that the flow rate is just 2 liters per minute, the rise in water temperature will be slightly less than 10 Kelvins. This heat energy can then be transported to a relatively large radiator capable of raising the temperature of 20,000 liters (706 cubic feet) of air per minute by about 3 Kelvins.

Persons skilled in the art will recognize that many modifications and variations are possible in the details, materials, and arrangements of the parts and actions which have been described and illustrated in order to explain the nature of this invention and that such modifications and variations do not depart from the spirit and scope of the teachings and claims contained therein.

What is claimed:

1. A method of directly cooling a semiconductor device, wherein the semiconductor device comprises a plurality of light emitting diodes mounted on a substrate in a housing, comprising:

applying a liquid coolant to directly cool light emissive surfaces of the LEDs, the liquid flowing in a channel between the LEDs and a window, through which light from the emissive surfaces is transmitted.

2. The method of claim 1, further comprising applying a first coolant to directly cool the LEDs and applying a second coolant to the substrate to indirectly cool the LEDs.

3. The method of claim 2, wherein a heat pipe is used to contain the second coolant.

4. The method of claim 2, wherein the first coolant comprises a fluid having an index of refraction matching at material at an optical interface, and the second coolant comprises a high heat capacity fluid.

5. The method of claim 4, wherein the second coolant is water.

6. The method of claim 1 further comprising using the light to transform a target material.

7. The method of claim 6 wherein the transformation is a curing operation on a photo-curable material.

8. The method of claim 6 wherein the light emitted from the LEDs and effecting the material transformation comprises a UV wavelength.

9. The method of claim 1 wherein the light emitting diodes output IR light.

* * * * *